United States Patent
Herrmann et al.

(10) Patent No.: US 10,202,079 B2
(45) Date of Patent: Feb. 12, 2019

(54) ELECTRONIC DEVICE AND REAR-VIEW DEVICE

(71) Applicant: SMR Patents S.à.r.l., Luxembourg (LU)

(72) Inventors: Andreas Herrmann, Winnenden-Baach (DE); Artem Rudi, Ludwigsburg (DE)

(73) Assignee: SMR Patents S.a.r.l., Luxembourg (LU)

(*) Notice: Subject to any disclaimer, the term of this patent is extended or adjusted under 35 U.S.C. 154(b) by 60 days.

(21) Appl. No.: 15/256,532

(22) Filed: Sep. 3, 2016

(65) Prior Publication Data

US 2017/0066379 A1 Mar. 9, 2017

(30) Foreign Application Priority Data

Sep. 3, 2015 (EP) ..................... 15183748

(51) Int. Cl.
*B60R 1/02* (2006.01)
*B60R 1/12* (2006.01)
(Continued)

(52) U.S. Cl.
CPC .............. *B60R 1/1207* (2013.01); *B60R 1/02* (2013.01); *B60R 16/03* (2013.01); *F21V 19/003* (2013.01);
(Continued)

(58) Field of Classification Search
CPC ......... B60R 16/03; B60R 1/02; B60R 1/1207; B60R 1/06; F21V 19/003; F21V 23/002;
(Continued)

(56) References Cited

U.S. PATENT DOCUMENTS 6,561,685 B2 * 5/2003 Weber .................. B60Q 1/2665
315/185 R
7,053,322 B2 5/2006 Helmstetter et al.
(Continued)

FOREIGN PATENT DOCUMENTS

DE 102007037483 A1 2/2009
DE 102012108480 B3 2/2014
(Continued)

OTHER PUBLICATIONS

European Search Report, Application No. EP15183748 dated May 10, 2016.

*Primary Examiner* — Peggy Neils
(74) *Attorney, Agent, or Firm* — MacMillan, Sobanski & Todd, LLC

(57) ABSTRACT

An improved rear-view device for a motor vehicle includes an electronic device with at least one housing device, comprising at least one floor piece and a cover piece configured to be arranged on the floor piece. The floor piece and the cover piece, in the joined state, delimit an at least almost completely closed cavity. At least one first retaining means of a retaining unit, fixes the housing device in or on the rear-view device. At least one electronic module comprises at least one conductor unit and at least one contact means connected with the conductor unit. The conductor unit is arranged on a surface of the floor piece and/or cover piece and turned towards the cavity. The conductor unit comprises at least one carrier and at least one conductor track applied directly to the carrier. The contact means extends through the cover piece and/or through the floor piece with at least one protruding contact section and is accessible externally. The at least one carrier of the at least one conductor unit is formed at least in sections by a functional surface of the floor piece and/or the cover piece adjacent to the cavity and turned towards the cavity. The
(Continued)

cover piece and/or floor piece forms a common component with the at least one first retaining means of the retaining unit.

16 Claims, 4 Drawing Sheets

(51) Int. Cl.
| | |
|---|---|
| *B60R 16/03* | (2006.01) |
| *F21V 23/00* | (2015.01) |
| *F21V 23/06* | (2006.01) |
| *F21V 19/00* | (2006.01) |
| *H05K 1/02* | (2006.01) |
| *B60Q 1/26* | (2006.01) |

(52) U.S. Cl.
CPC .......... *F21V 23/002* (2013.01); *F21V 23/009* (2013.01); *F21V 23/06* (2013.01); *H05K 1/0284* (2013.01); *B60Q 1/2665* (2013.01); *H05K 2201/0999* (2013.01)

(58) Field of Classification Search
CPC ..... F21V 23/009; F21V 23/06; B60Q 1/2665; H05K 2201/0999
See application file for complete search history.

(56) References Cited

U.S. PATENT DOCUMENTS

| | | | |
|---|---|---|---|
| 8,282,237 B2 * | 10/2012 | Vittozzi | B60Q 1/2615 340/473 |
| 8,430,535 B2 * | 4/2013 | Watanabe | F21V 19/001 362/294 |
| 8,444,308 B2 * | 5/2013 | Matsunaga | F21K 9/00 362/373 |
| 8,690,389 B2 * | 4/2014 | Zaderej | F21V 29/20 362/235 |
| 8,794,794 B2 * | 8/2014 | Kato | F21V 23/006 362/249.02 |
| 2014/0070068 A1 | 3/2014 | Schmierer | |
| 2017/0122544 A1 * | 5/2017 | Schmitt | F21V 31/005 |

FOREIGN PATENT DOCUMENTS

| | | | |
|---|---|---|---|
| EP | 1205350 | A2 | 5/2002 |
| EP | 1205350 | A3 | 6/2005 |
| EP | 1623885 | A2 | 2/2006 |
| EP | 1623885 | A3 | 7/2007 |

* cited by examiner

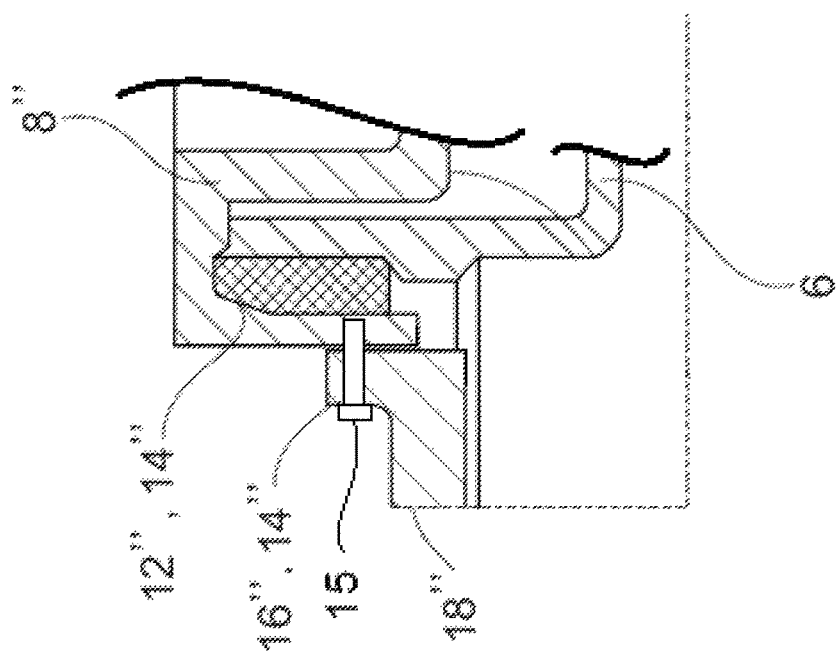
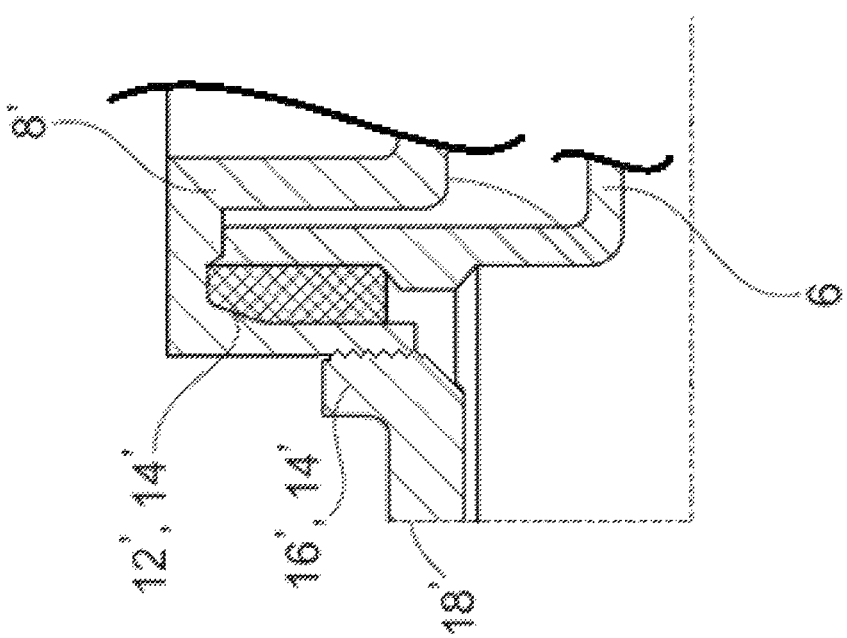

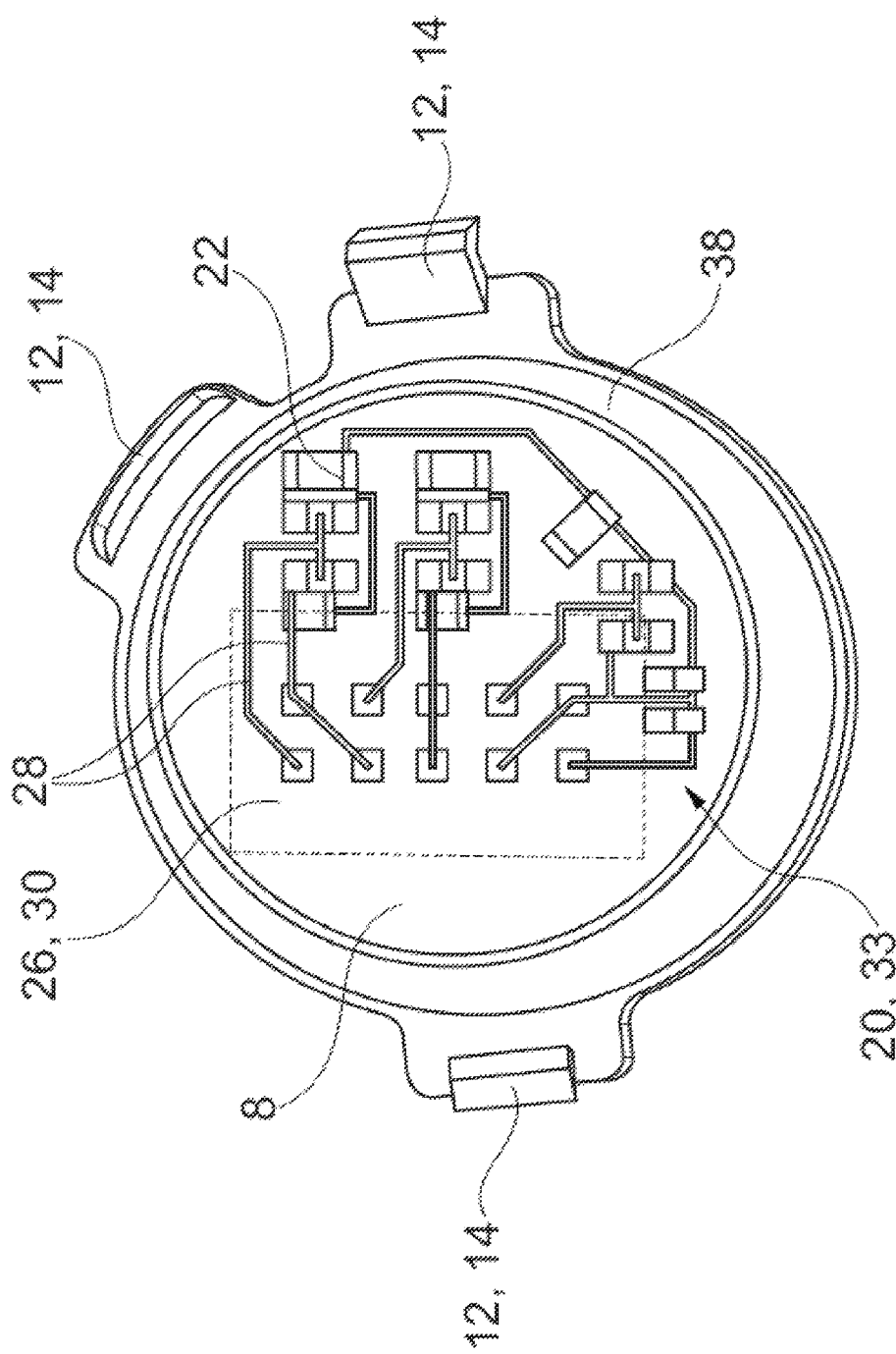

ELECTRONIC DEVICE AND REAR-VIEW DEVICE

CROSS-REFERENCE TO RELATED APPLICATIONS

This application claims priority from European Patent Application No. 15183748.1, filed Sep. 3, 2015, the disclosure of which is incorporated herein by reference.

BACKGROUND OF THE INVENTION

This invention relates in general to motor vehicle rear-view devices. In particular, this invention relates to an electronic device, configured for use in a rear-view device of a motor vehicle, and a rear-view device comprising such an electronic device.

Electronic devices are known in rear-view devices, such as exterior mirrors, of motor vehicles. These in each case comprise an electronic module, which is arranged in a housing device and fixed in the rear-view device, for example the exterior mirror. Because of the high number of electrical loads, such as indicator lamps, blind-spot displays, proximity light or what are known as logo lamps, each electrical load is assigned with its own electronic module with its own housing device. Each of the electronic modules consists of a conductor unit, which are fixed as separate components in the respective housing device.

Because of the high number of electrical loads and the correspondingly high number of electronic modules functionally assigned to the electrical loads, in the known rear-view devices a correspondingly high amount of space has to be allowed for, to arrange the high number of electronic devices. Furthermore, assembly of the individual electronic modules has proven to be time-consuming and maintenance is difficult.

From EP 1 205350 A2 a steering column switch is known, in particular for motor vehicles, having a base housing with floor and side walls, a housing cover, with several switch units and conducting tracks that contact the switch units. Here the conducting tracks are designed as a single- or multi-part contact grid. In addition, the contact grid extends over sections of at least one side wall and the floor of the base housing.

A compact multifunctional electronic assembly with a circuit substrate is described in DE 102007037483 A1. Here on the outer surface of the circuit substrate a plurality of electronic components, in particular switching elements, is arranged. The connection of the components with each other and with a contact device is carried out via conductor tracks and contact surfaces, which are arranged running multi-dimensionally in surface areas of the circuit carrier. The circuit carrier is designed as an injection molded part.

EP 1623885 A2 discloses an airbag module for use in a vehicle occupant restraint system having a generator carrier made of plastic, with a printed circuit formed on the generator carrier by metal precipitation, wherein the printed circuit interacts with a switching element arranged on a section of the generator carrier to trigger an electric functional element.

Thus, it would be desirable to provide an electronic device, configured for use in a rear-view device of a motor vehicle, having a compact design and for which the assembly operations are simplified.

SUMMARY OF THE INVENTION

This invention relates to an electronic device, configured for use in a rear-view device of a motor vehicle, and a rear-view device comprising such an electronic device.

The invention provides an improved rear-view device for a motor vehicle by the electronic device of claim 1, which is configured for use in a rear-view device for a motor vehicle, with at least one housing device, comprising at least one floor piece and a cover piece arranged or that can be arranged on the floor piece, which in the joined state delimit an at least almost completely closed cavity, with at least one first retaining means of a retaining unit, through which the housing device can be or is fixed in or on the rear-view device, and with at least one electronic module, comprising at least one conductor unit and at least one contact means connected with the conductor unit, wherein on a surface of the floor piece and/or cover piece turned towards the cavity the conductor unit is arranged, comprising at least one carrier and at least one conductor track applied directly to the carrier, the contact means extending through the cover piece and/or through the floor piece with at least one protruding contact section is accessible externally, the at least one carrier of the at least one conductor unit is formed at least in sections by a functional surface of the floor piece and/or the cover piece adjacent to the cavity and turned towards the cavity, and the cover piece and/or floor piece with the at least one first retaining means of the retaining unit form or forms a common component.

Additional preferred embodiments of the electronic devices according to the invention are also described in claims 2 to 15.

In that at least one carrier of a conductor unit is formed at least in sections by a functional surface of the floor piece and/or the cover piece, the electronic device has fewer components and can be compactly designed. This also reduces the assembly effort.

Apart from the conductor tracks the conductor unit can comprise further electronic components such as integrated circuits (IC), capacitors, resistors and similar. These can also be arranged on the carrier, in particular on the functional surface of the floor piece and/or the cover piece.

The conductor unit can have a board-like design, without comprising a separate component. In such a case the conductor unit can be formed entirely of the functional surface. It is conceivable that components of the conductor unit are attachable as separate components to the functional surface, without the conductor unit as a whole being formed by the separate component.

In a further development of the abovementioned exemplary embodiment it has proven advantageous if at least one carrier of the at least one carrier is formed entirely by the functional surface of the floor piece and/or cover piece. In such a case a carrier of the electronic module formed as a separate component can be fully dispensed with, if the functional surface of the floor piece or the cover piece takes over the function of the carrier previously formed as a separate component.

The conductor track applied to the carrier, in particular to the functional surface, can essentially be correspondingly realized according to the conductor units formed as separate components. The electronic device however can have a compact design, if the conductor track applied directly to the carrier, in particular the functional surface, is applied by injection molding (Molded Interconnect Devices [MID]), by a conductive foil (Inmold-Labeling [IML]) and/or by Laser Direct Structuring [LDS] directly to the carrier, in particular the functional surface.

Furthermore, the number of housing devices and electronic modules arranged therein can be reduced if the electronic module comprises a plurality of conductor units and/or if the electronic module forms a common control unit for a plurality of electrical loads of the rear-view device, wherein each electrical load is or can be functionally assigned with at least one conductor unit and wherein in particular at least one main conductor unit comprises a driver circuit via which the conductor units functionally assigned to the electrical loads are individually and/or jointly controllable.

This allows to combine the electronic modules previously operated separately and independently of one another in a common electronic module. In this way the number of housing devices to be allowed for can also be reduced to a single housing device, in which the common electronic module is arranged. This allows the rear-view device to have a compact design with fewer components, since less space has to be allowed for to accommodate the electronic device.

It has furthermore proven advantageous if the at least one retaining unit comprises at least one first retaining means, which together with the cover piece and/or the floor piece forms a common component, in particular an injection molded part.

If the first retaining means of the retaining unit, with the cover piece or the floor piece, forms a common component, in particular an injection-molded part, the electronic device can be designed with less components and the ease of assembly further increased.

It has further proven advantageous if the housing device can be or is fixed by the retaining unit, in particular by the first retaining means, detachably, in particular by means of a rear grip, in or on the rear-view device and/or if the first retaining means comprises an externally threaded section on the cover piece or on the floor piece, a latching element, such as clips or a bayonet fitting, and/or a screw or bolt element.

In a further development of the abovementioned exemplary embodiment it has proven advantageous if the retaining unit comprises a second retaining means fixed in or on the rear-view device, in particular fixed to a retaining plate of the rear-view device, comprising an internally threaded section, which is able to interact with the first retaining means designed as externally threaded section, comprising a rear-gripping receiving means interacting with the first retaining means designed as a latching element and/or an accommodation for the first retaining means designed as a screw or bolt element.

When manufacturing the electronic device individual components of the electronic module are arranged mechanically on the functional surface of the cover piece and/or of the floor piece. Here the tool used for assembling the components of the electronic module runs parallel to a plane of the functional surface of the cover piece and/or of the floor piece, said plane being spanned by vectors in x and y direction, wherein when joining individual components transversally to this plane, the tool runs along a z direction. In order to keep the movement in z direction low, it has proven advantageous if the first retaining means is fixed with a first end to an end of the cover piece or the floor piece opposite of the functional surface of the cover piece or the floor piece and is arranged with a second end extending in the direction of the functional surface, wherein the first retaining means is designed to extend without overlapping to the plane of the functional surface and the second end has a distance from the plane of the functional surface.

This has proven particularly advantageous if the first retaining means is designed as a clip. In such a case the retaining means designed as clips extend in z direction, but do not protrude beyond the functional surface. This means that wide assembly paths of the tool used for assembly, which would be necessary for retaining means protruding beyond the functional surface, can be prevented in order not to damage the retaining means.

If the first retaining means, for example, comprises an externally threaded section on the cover piece or on the floor piece of the housing device and the second retaining means comprises an internally threaded section, the electronic device can be readily fixedly screwed into the rear-view device without tooling.

If the first retaining means comprises a latching element and the second retaining means a receiving means interacting with the latching means, the electronic device can be assembled simply by clipping the electronic device in the rear-view device. Furthermore, in such a case the maintenance of the electronic device is also simplified, since the electronic device can be mounted on the rear-view device without tooling or removed without tooling by releasing the clip connection.

The electronic device can easily be connected with a power source, if the at least one protruding and externally accessible contact section of the at least one contact means comprises at least one pin, in particular a plurality of pins, via which the electronic module can be or is connected with at least one power source and/or with at least one electrical load.

Furthermore, in one exemplary embodiment of the electronic device it has proven advantageous if the electronic device comprises at least one energy storage arranged in the cavity of the housing device and functional assigned in the electronic module, in particular for storing and releasing electrical energy.

In such a case it is for example possible to hold an energy reserve independent of the power source, in order for example to balance peaks or in order in the event of a power supply failure to keep a reserve of energy available in order, for example, to maintain warning light functions for at least a limited time.

In order to simplify joining of the cover piece to the floor piece, in particular in order to reduce the danger of tilting when joining the cover piece to the floor piece, it has proven advantageous if the cover piece and the floor piece in each case comprise a cylindrical section, by which, when they are being joined, they can be slid into each other, in particular concentrically, telescopically, wherein the cover piece comprises an edge section protruding radially with regard to the cylindrical section and extending fully around the outer surface of the cover piece, which when the cover piece and the floor piece are joined forms an end stop.

As a result of the round shape further an even distribution of the clamping force of the retaining unit is achieved and through the provision of a uniform, round, contact area a good sealing surface is made available.

In a further development of the last-mentioned embodiment it has proven especially advantageous if the cover piece and/or the floor piece has/have a pot-like design, wherein at least the cover piece comprises an extensive base plate adjacent to the cylindrical section, which runs transversally or inclined to the axis of the cylindrical section, and on its side turned towards the floor piece the functional surface is arranged and on its side turned away from the floor piece and surrounded by the cylindrical section the contact section of the contact means is arranged.

As a result of the floor piece and the cover piece each being designed with a cylindrical section, which when they are being joined can be concentrically and telescopically slid into each other, a uniform contact area is made available. In this way a gap existing between the floor piece and the cover piece can be kept small. It has further proven particularly advantageous if the electronic device comprises at least one sealant arranged between the cover piece and the floor piece, in particular between the floor piece and the edge section of the cover piece, through which the cavity of the housing device can be sealed with respect to a gap existing between cover piece and floor piece.

In this way an ingress of moisture and dirt into the cavity is prevented, as a result of which the danger of a contamination of, in particular damage to, the electronic module is reduced.

The electronic device can be particularly easily assembled and disassembled, for maintenance purposes, if the floor piece of the housing device comprises a one-piece element of a component, in particular a one-piece injection-molded part, such as the retaining plate, of the rear-view device. In such a case the individual components of the electronic device can be pre-assembled so that for final assembly just the cover piece, to which the electronic module, the first retaining means of the retaining unit as well as the sealant are fixed, is screwed or glued to the floor piece. In this way the previous plurality of individual electronic modules with the previous plurality of housing devices, which in each case were formed by a plurality of separate components, can be assembled and disassembled in a single movement.

The electronic device can furthermore be manufactured with reduced weight and economically, if the floor piece, the cover piece, the first retaining means and/or the second retaining means comprise a plastic.

The electronic device according to the invention can be designed as a lighting module, in particular for a perimeter light of the rear-view device.

Finally, the object of the invention is achieved by a rear-view device with at least one electronic device according to the invention.

The rear-view device can contain at least one reflective element and/or at least one camera.

The electronic device and the rear-view device have proven to be advantageous in a number of respects:

Because a floor piece and/or the cover piece comprise a functional surface turned towards the cavity, which at least partly forms the carrier of the conductor unit, the electronic device can be designed with a reduced number of components.

Because in the housing device a plurality of conductor units can be arranged, which form a common electronic module, the previous plurality of electronic devices can be arranged in a common electronic device, in particular in a common housing device. In this way the space that has to be allowed for in the rear-view device is reduced.

Various aspects of this invention will become apparent to those skilled in the art from the following detailed description of the preferred embodiment, when read in light of the accompanying drawings.

BRIEF DESCRIPTION OF THE DRAWINGS

FIG. 1B is an enlarged schematic illustration of an alternative embodiment of the retaining unit of FIG. 1A.

FIG. 1C is an enlarged schematic illustration of another alternative embodiment of the retaining unit of FIG. 1A.

FIG. 3 is a bottom view of the electronic device according to FIG. 2.

DETAILED DESCRIPTION OF THE PREFERRED EMBODIMENT

Figure 1A:
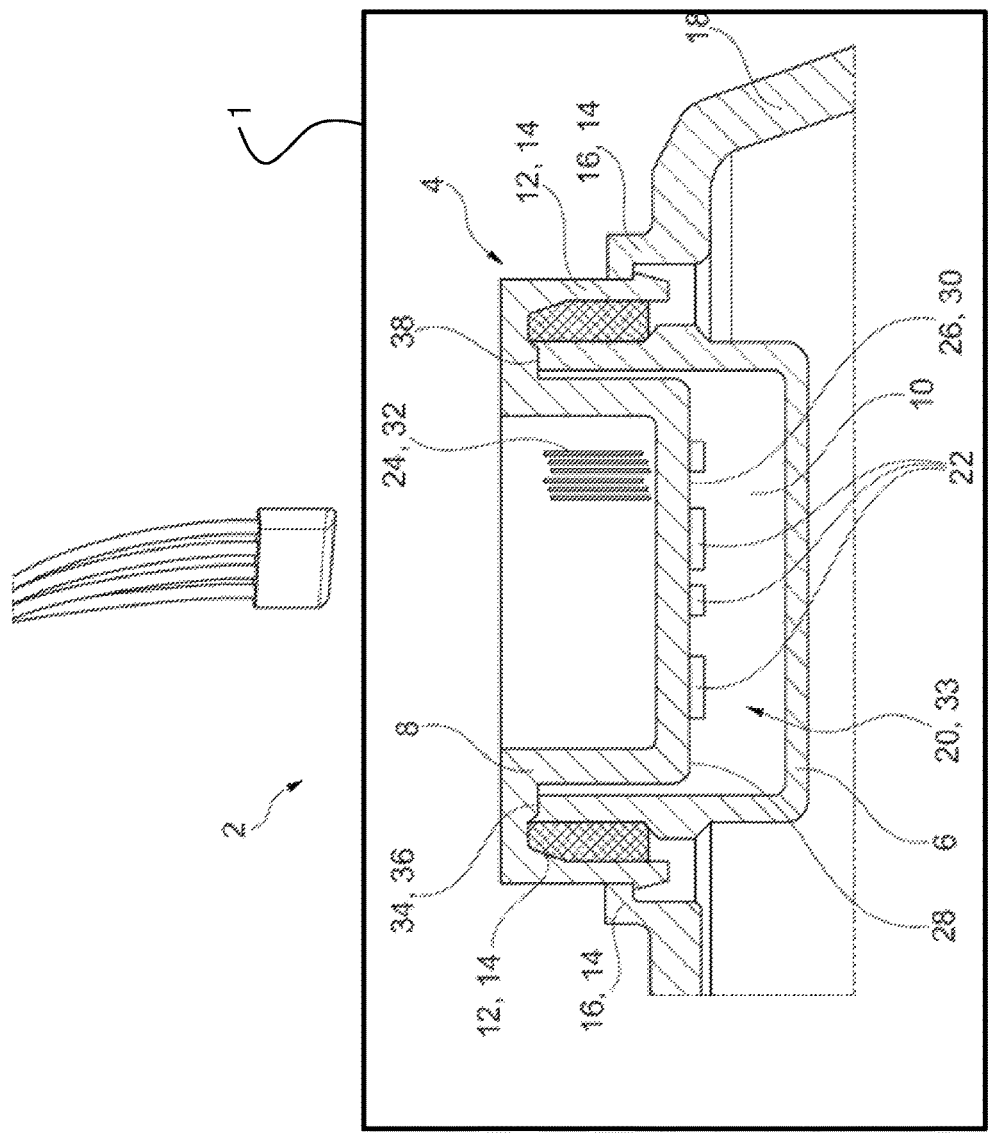
FIG. 1A is a schematic illustration of a rear-view device showing a sectional side view of an embodiment of an electronic device.

Referring now to the drawings, there is illustrated in FIGS. 1A-3 an electronic device for a rear-view device 1 for a motor vehicle given reference numeral 2 in its entirety. The electronic device 2 comprises a housing device 4, comprising a floor piece 6 and cover piece 8 arranged on the floor piece 6. The floor piece 6 and the cover piece 8 delimit a cavity 10.

In the exemplary embodiment shown in the figures on the cover piece 8 a first retaining means 12 of a retaining unit 14 is fixed. The exemplary embodiment shown in the figures comprises three first retaining means 12 which engage with correspondingly designed second retaining means 16, arranged on a retaining plate 18 of the rear-view device, in order to create a rear grip. As shown in FIG. 1A, the retaining unit 14 is illustrated as engaging clips or bayonet fittings. FIG. 1B illustrates an alternative retaining unit 14' comprising mating threaded surfaces 12', 16' of a cover 8' and a retaining plate 18', respectively. FIG. 1C illustrates another embodiment of a retaining unit 14" comprising a bolt or screw fastener 15 in conjunction with a treaded hole 12" and a through hole 16".

Furthermore, the electronic device 2 comprises an electronic module 20, comprising a conductor unit 22 and a contact means 24. The at least one conductor unit 22 is arranged on a surface of the cover piece 8 turned towards the cavity 10. The one conductor unit 22 comprises a carrier 26 and conductor tracks 28 applied directly to the carrier 26. The carrier 26 is formed by a functional surface 30 of the cover piece 8. The functional surface 30 is an element of the cover piece 8 on which the conductor tracks 28 have been applied to, for example by means of injection molding, by a conductive foil or by laser direct structuring.

The contact means 24 is connected on one side with the conductor unit 22 and extends through the cover piece 8 so that it is accessible with a contact section 32 from outside.

In the exemplary embodiment shown in the figures the electronic module 20 comprises a plurality of conductor units 22, forming a common control unit 33 for a plurality of electrical loads of the rear-view device. Here the contact section 32 firstly serves to connect the individual electrical loads to the common electronic module 20 and secondly to establish a connection to a power source, which is for example arranged in the motor vehicle.

In the exemplary embodiment shown in the figures both the cover piece 8 and the floor piece 6 comprise a cylindrical section, by which, when they are being joined, they are slid into each other concentrically and telescopically. Here the cover piece 8 has an edge section 34 protruding radially to the cylindrical section and fully surrounding the outer surface of the cover piece 8. When the cover piece 8 is joined this forms an end stop 36 for the floor piece 6. In order to reduce the danger of an ingress of dirt and moisture into the cavity 10 of the housing device 4, between the cover piece 8 and floor piece 6, in particular between the edge section 34 of the cover piece 8 and the floor piece 6, a sealant 38 is provided.

Figure 2:
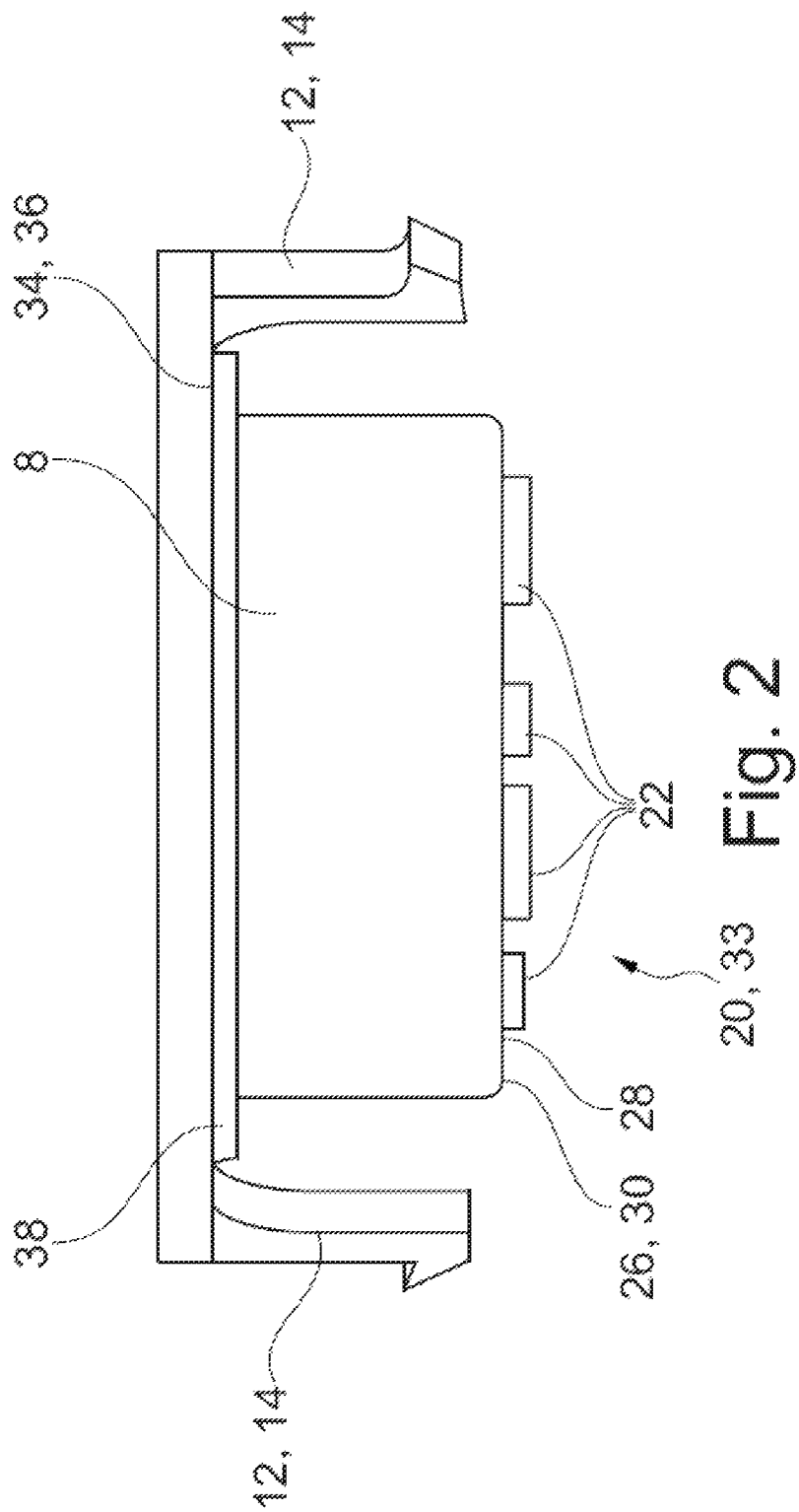
FIG. 2 is a side view of a cover piece with a first retaining means and an electronic module according to FIG. 1A.

FIGS. 2 and 3 show a side view and a bottom view, respectively, of the cover piece 8 shown in FIG. 1A. The first retaining means 12 of the retaining unit 14 and the cover piece 8 comprise a common component.

In the following the assembly and disassembly, respectively, of the electronic device 2 is outlined:

In a retaining plate 18 of the rear-view device the floor piece 6 and the second retaining means 16 of the retaining unit 14 are fixed. In the exemplary embodiment shown in FIG. 1 retaining plate 18, second retaining means 16 of the retaining unit 14, and floor piece 6, comprise a common component, in particular a common injection molded component.

On the cover piece 8 the first retaining means 12 of the retaining unit 14 are fixed and in the exemplary embodiment shown in FIGS. 1A to 3 these comprise a common component with the cover piece 8, in particular a common injection molded component. Furthermore, on the cover piece 8 the sealant 38 and the electronic module with its components of conductor unit 22, carrier 26, formed by the functional surface 30 on the cover piece 8, and the conductors tracks 28 arranged on the functional surface 30 and the contact means 24 are fixed. For assembly the cover piece 8 is introduced with a cylindrical section axially into the floor piece 6. Upon reaching the joined end position a further movement of the cover piece 8 in the direction of the floor piece 6 is limited by the edge section 34 of the cover piece 8, which forms the end stop 36, and by the sealant 38 arranged in the edge section 34. In this arrangement the first retaining means 12 of the retaining unit 14 interlock with the second retaining means 16 of the retaining unit 14. In this way the cover piece 8 is fixed against moving backwards.

In order to achieve operational readiness, the electrical loads and the power source can now be connected via the contact section 32 of the contact means 24 with the electronic device 2.

In order to disassemble the electronic device 2 the first retaining means 12 of the retaining unit 14 are released from their interlock, as a result of which the cover piece 8 is now free to move against the assembly direction. The cover piece 8 can now be removed against the assembly direction from the floor piece 6.

The principle and mode of operation of this invention have been explained and illustrated in its preferred embodiment. However, it must be understood that this invention may be practiced otherwise than as specifically explained and illustrated without departing from its spirit or scope.

What is claimed is:

1. An electronic device of a rear-view device of a motor vehicle comprising:
    at least one housing device which comprises at least one floor piece and a cover piece arranged or that can be arranged on the floor piece, which in the joined state delimits an at least almost completely closed cavity,
    at least one first retaining means of a retaining unit, through which the housing device is fixed in or on the rear-view device, and
    at least one electronic module, which comprises at least one conductor unit and at least one contact means connected with the conductor unit,
    wherein on a surface of the floor piece and/or cover piece turned towards the cavity the conductor unit is arranged, which comprises at least one carrier and at least one conductor track applied directly to the carrier,
    the contact means extending through the cover piece and/or through the floor piece with at least one protruding contact section is accessible externally,
    the at least one carrier of the at least one conductor unit is formed at least in sections by a functional surface of the floor piece and/or the cover piece adjacent to the cavity and turned towards the cavity, and
    the cover piece and/or floor piece with the at least one first retaining means of the retaining unit form or forms a common component.

2. The electronic device according to claim 1, wherein the at least one carrier is formed entirely by the functional surface of the floor piece and/or cover piece.

3. The electronic device according to claim 1, wherein the conductor track applied directly to the carrier, in particular the functional surface, is applied by injection molding (Molded Interconnect Devices [MID]), by a conductive foil (Inmold-Labeling [IML]) and/or by Laser Direct Structuring [LDS] directly to the carrier, in particular the functional surface.

4. The electronic device according to claim 1, wherein the electronic module comprises a plurality of conductor units and/or the electronic module forms a common control unit for a plurality of electrical loads of the rear-view device, wherein each electrical load is or can be functionally assigned with at least one conductor unit, and
    wherein in particular at least one main conductor unit comprises a driver circuit, via which the conductor units functionally assigned to the electrical loads are individually and/or jointly controllable.

5. The electronic device according to claim 1, wherein the common component of the at least one first retaining means and of the cover piece and/or of the floor piece is an injection molded part, and/or the cover piece with the at least one first retaining means of the retaining unit is formed as a common component.

6. The electronic device according to claim 1, wherein the housing device can be or is fixed by the first retaining means, detachably, in particular by means of a rear grip, in or on the rear-view device, and/or
    the first retaining means comprises an externally threaded section on the cover piece or on the floor piece, a latching element, such as clips or a bayonet fitting, and/or a screw or bolt element.

7. The electronic device according to claim 6, wherein the first retaining means is fixed with a first end to an end of the cover piece or the floor piece opposite of the functional surface of the cover piece or floor piece and is arranged with a second end extending in the direction of the functional surface, and wherein the first retaining means is designed to extend without overlapping to the plane of the functional surface and the second end has a distance from the plane of the functional surface.

8. The electronic device according to claim 6, wherein the retaining unit comprises a second retaining means fixed in or on the rear-view device, in particular on a retaining plate of the rear-view device, and
    wherein preferably the second retaining means comprises an internally threaded section which is, able to interact with the first retaining means designed as externally threaded section, a rear-gripping receiving means interacting with the first retaining means designed as a latching element and/or an accommodation for the first retaining means designed as a screw or bolt element.

9. The electronic device according to claim 1, wherein the at least one protruding and externally accessible contact section of the at least one contact means comprises at least one pin, in particular a plurality of pins, via which the electronic module can be or is connected with at least one power source and/or with at least one electrical load, and/or
    the electronic device comprises at least one energy storage arranged in the cavity of the housing device functional assigned to the electronic module, in particular for storing and releasing electrical energy.

10. The electronic device according to claim 1, wherein the cover piece and the floor piece in each case comprise
a cylindrical section, by which, when they are being joined, they can be slid into each other, in particular concentrically, telescopically, and
wherein the cover piece comprises an edge section protruding radially with regard to the cylindrical section and extending fully around the outer surface of the cover piece, which when the cover piece and the floor piece are joined forms an end stop.

11. The electronic device according to claim 9, wherein the cover piece and/or the floor piece has/have a pot-like design, and
wherein at least the cover piece comprises an extensive base plate adjacent to the cylindrical section, which runs transversally or inclined to the axis of the cylindrical section, and on its side turned towards the floor piece the functional surface is arranged and on its side turned away from the floor piece and surrounded by the cylindrical section the contact section of the contact means is arranged.

12. The electronic device according to claim 1, wherein at least one sealant is arranged between the cover piece and the floor piece, in particular between the floor piece and the edge section of the cover piece, through which the cavity of the housing device can be sealed with respect to a gap existing between cover piece and floor piece.

13. The electronic device according to claim 1, wherein the rear-view device includes a retaining plate and a second retaining means, the floor piece of the housing device comprises an element of a component configured as a one-piece injection molded part of the retaining plate and/or the second retaining means of the rear-view device.

14. The electronic device according to claim 1, wherein the floor piece, the cover piece, the first retaining means and/or the second retaining means comprise a plastic.

15. The electronic device according to claim 1, wherein the electronic device is designed as a lighting module.

16. The electronic device according to claim 1, wherein the retaining unit comprises a second retaining means
fixed on a retaining plate of the rear-view device, and
the floor piece of the housing device is designed with includes the second retaining means and the retaining plate of the rear-view device, and
the cover piece of the housing device includes the first retaining means.

* * * * *

UNITED STATES PATENT AND TRADEMARK OFFICE
CERTIFICATE OF CORRECTION

PATENT NO. : 10,202,079 B2  
APPLICATION NO. : 15/256532  
DATED : February 12, 2019  
INVENTOR(S) : Andreas Herrmann et al.

Page 1 of 1

It is certified that error appears in the above-identified patent and that said Letters Patent is hereby corrected as shown below:

In the Claims

Column 10, Claim 16, Line 20, after "device" delete "is designed with".

Signed and Sealed this  
Twenty-sixth Day of March, 2019

Andrei Iancu  
*Director of the United States Patent and Trademark Office*